United States Patent
Lin et al.

(10) Patent No.: US 6,297,686 B1
(45) Date of Patent: Oct. 2, 2001

(54) SEMICONDUCTOR INTEGRATED CIRCUIT FOR LOW-VOLTAGE HIGH-SPEED OPERATION

(75) Inventors: Shi-Tron Lin, Taipei; Yung-Chow Peng, Hsinchu, both of (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/321,849

(22) Filed: May 28, 1999

(51) Int. Cl.[7] .................................................. H03K 3/01
(52) U.S. Cl. ........................ 327/534; 327/328; 327/333; 327/437
(58) Field of Search .......................... 327/328, 333, 327/437, 534, 535; 326/82, 83, 86

(56) References Cited

U.S. PATENT DOCUMENTS

| | | | |
|---|---|---|---|
| 4,191,898 | * 3/1980 | Ulmer | 326/68 |
| 4,698,789 | * 10/1987 | Iizuka | 365/226 |
| 5,461,338 | 10/1995 | Hirayama et al. | 327/534 |
| 5,559,368 | 9/1996 | Hu et al. | 287/369 |
| 5,689,144 | 11/1997 | Williams | 307/103 |
| 5,780,899 | 7/1998 | Hu et al. | 257/335 |

* cited by examiner

Primary Examiner—Terry D. Cunningham
Assistant Examiner—Quan Tra
(74) Attorney, Agent, or Firm—Finnegan, Henderson, Farabow, Garrett & Dunner, L.L.P.

(57) ABSTRACT

For low-voltage and high-speed operation of a MOSFET in an integrated circuit, a small voltage is applied to a source node, causing slight forward bias of the source junction and thereby reducing its threshold voltage. Due to the combined effects of the bias at the source node and a body effect, the reduction in threshold voltage is larger than the absolute value of the source voltage being applied. A performance improvement over simply applying a bias voltage to the body (well) results. Detection of an event can be used to apply the performance boost to a critical path in the integrated circuit only when needed. Upon detection of a logic event, which determines that a signal will propagate through the critical path shortly thereafter, the source-node bias for circuit elements in the critical path can be adjusted in time for a speed improvement. However, the source remains at another potential when no signal is passing through the critical-path, to save power when not boosting speed.

11 Claims, 8 Drawing Sheets

SEMICONDUCTOR INTEGRATED CIRCUIT FOR LOW-VOLTAGE HIGH-SPEED OPERATION

BACKGROUND OF THE INVENTION

A. Field of the Invention

The present invention relates to a method and circuit for biasing transistors to increase performance. The disclosed method and circuit are applicable to boosting performance of a critical path in a larger circuit upon the occurrence of a triggering event.

B. Description of the Related Art

Due to the so-called body effect, which is known to those skilled in the integrated-circuit art, the threshold voltage $V_T$ of a transistor, for example a metal oxide semiconductor field effect transistor (MOSFET), can be modified by applying a bias voltage to the substrate. For example, a negative substrate bias relative to a source terminal raises the threshold voltage of an n-type MOSFET (NMOSFET) by reverse-biasing the source-substrate junction, while a slightly positive substrate bias relative to a source terminal reduces the threshold voltage of an NMOSFET by forward-biasing the source-substrate junction. Such biasing of opposite polarities is equally applicable to p-type MOSFETs (PMOSFET) as well, as will be appreciated by those in the integrated circuit art. The change in the threshold voltage $V_T$ is typically less than the absolute value of the substrate bias for transistors biased in such a manner. Depending on the structure of the transistor in question, the substrate may also be referred to as the body or replaced by the well of the transistor.

Since $I_{ON}$, the turned-on saturation current of a MOSFET, is proportional to $(V_{DD}-V_T)^2$, where $V_{DD}$ is the drain voltage, a reduction in $V_T$ is highly effective in boosting $I_{ON}$ which improves circuit speed. This way of increasing transistor speed is especially useful in low-voltage circuits, for example where $V_{DD}$ is 1.5 volts or less. A drawback to forward-biasing the source-body junction to lower $V_T$ is a greater leakage current through the junction.

FIG. 1 shows a conventional way of lowering $V_T$ in an NMOSFET 10 having a source 20 tied to ground. A p-type body 30 is biased with a body voltage $V_b$ derived from a gate 40. A drain 50 is connected to $V_{DD}$ (not shown). Though a wire is shown connecting the gate and body in FIG. 1, depending on the desired level for $V_T$, a voltage divider (not shown) may also be used between the gate and body to generate the desired body voltage $V_b$. In any event, $V_b$ is conventionally generated from the voltages already available on the chip, such as the gate voltage or $V_{DD}$.

Also known is a method of accelerating processing in a circuit path using the above conventional transistor biasing. Normally, the circuit path is known and consists of a number of transistors, gates or chips. As explained above, biased transistors have an associated leakage current, and thus use more power than necessary. Therefore, it is good design practice only to bias the transistors for speed when speed is actually needed. Typically, a sensing circuit senses when a signal is propagating toward the circuit path. This sensing circuit will trigger a switching circuit to forward-bias the transistors in the circuit path for maximum performance when the propagating signal arrives.

FIG. 2 illustrates a circuit layout for accomplishing the above-described conventional scheme. A circuit 60 includes a plurality of transistors $T_1$ to $T_N$, whose sources are all tied to $V_{SS}$ (ground). The respective bodies of transistors $T_1$ to $T_N$ are tied to a common line emanating from a switching circuit 70. This switching circuit switches the common line between $V_{SS}$ and a bias potential $V_b$ generated by a bias potential generation circuit 80. In FIG. 2, where the transistors are n-type and $V_{SS}$ is ground, $V_b$ would be a positive voltage in order to forward bias the source-body junction. Switching circuit 70 is controlled by standby detection circuit 90, which is triggered by some event to switch the transistors $T_1$ to $T_N$ out of standby mode ($V_{SS}$ applied), and into a biased state in preparation for signal propagation.

SUMMARY OF THE INVENTION

Accordingly, the present invention is directed to a method and apparatus for biasing transistors that substantially obviates one or more of the problems due to the limitations and disadvantages of the related art.

Advantages of the present invention include a greater reduction in threshold voltage for a given biasing voltage than conventional biasing. Additional features and advantages of the invention will be set forth in part in the description which follows, and in part will be obvious from the description, or may be learned by practice of the invention. The objectives and other advantages of the invention will be realized and attained by means of the elements and combinations particularly pointed out in the written description and claims hereof, as well as the appended drawings.

To achieve these and other advantages and in accordance with the purpose of the invention, as embodied and broadly described herein, the invention comprises an integrated circuit, including: a transistor having a source and a substrate with a junction therebetween, a bias voltage generator coupled to the source, and the substrate being one of connected and connectable to a predetermined voltage source, wherein the junction between the source and the substrate is forward biased when a bias voltage generated by the bias voltage generator is coupled to the source and the substrate is connected to the predetermined voltage.

Further in accordance with the invention, there is provided a method of increasing the speed of a circuit, which includes at least one transistor having a source and a substrate, the circuit being powered by a first supply voltage and a second supply voltage, the method including: providing a bias voltage having a level outside a voltage range defined by the first supply voltage and the second supply voltage, connecting the first supply voltage to the substrate of the transistor, and connecting the bias voltage to the source of the transistor.

Further in accordance with the invention, there is provided an integrated circuit including: a first supply voltage node and a second supply voltage node, a first gate powered by the first and second supply voltage nodes, a second gate powered by the first and second supply voltage nodes and a bias voltage node such that the second gate functions faster than the first gate, the second gate being coupled to an output of the first gate, and a level shifter connected between the first and second gates, to shift a level of the output of the first gate so that it can effectively operate the second gate.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIG. 5b is a timing diagram showing a sequence of events in FIG. 5a.

FIG. 5c shows an alternate way of generating a source bias to that shown in FIG. 5a.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

Integrated circuits tend to have at least two supply voltages. The highest of these is typically referred to as $V_{DD}$ and the lowest of these is typically referred to as $V_{SS}$. In low voltage logic circuits, $V_{DD}$ may be 1.5V and $V_{SS}$ may be 0V, but these particular values are only exemplary of possible values for the supply voltages $V_{DD}$ and $V_{SS}$.

Figure 1:
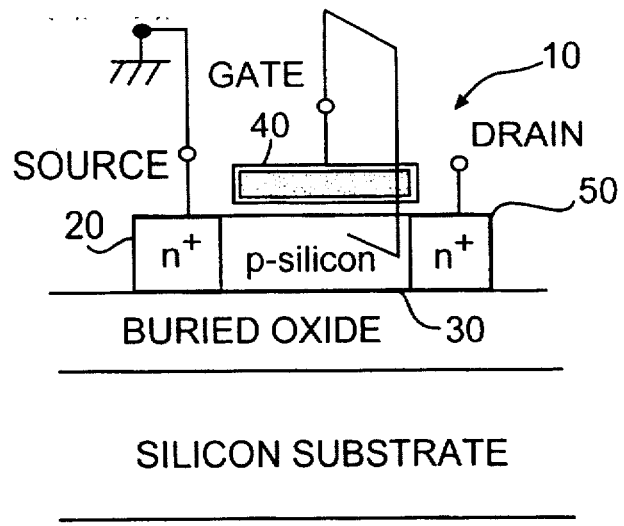
FIG. 1 is a schematic sectional side view of a conventional transistor.
Figure 2:
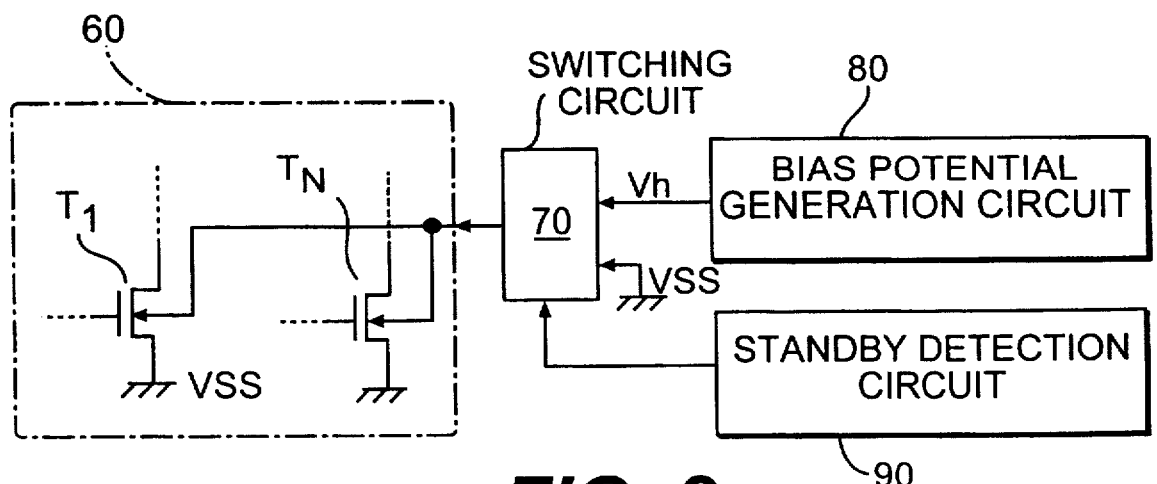
FIG. 2 is an illustration of a conventional circuit for applying a bias voltage $V_b$ to the body of one or more transistors in response to a detected event.
Figure 3:
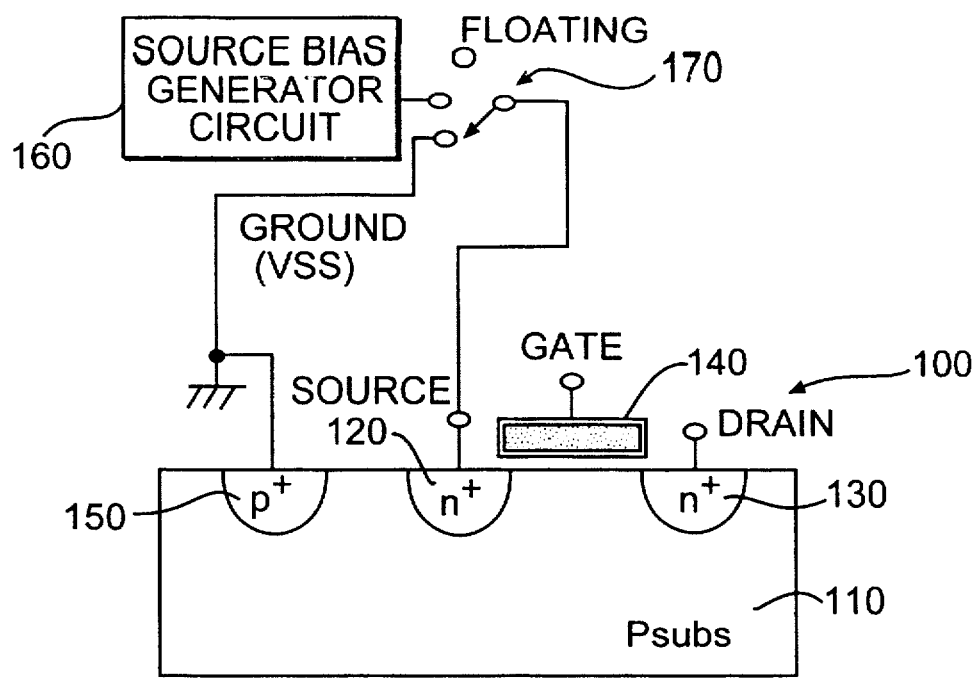
FIG. 3 is a schematic sectional side view of an NMOSFET connected according to a first embodiment of the present invention.

FIG. 3 shows a schematic sectional side view of an NMOSFET 100 to which a biasing voltage is applied according to a first embodiment of the present invention. As further described below, the present invention can be practiced with equal effectiveness in PMOSFETs. Such NMOSFETs and PMOSFETs may be insulated gate field effect transistors (IGFET). With reference to FIG. 3, NMOSFET 100 is formed in a p-type substrate 110 and includes a source 120, a drain 130, a gate 140, and a p-well 150 for applying a potential to substrate 110. Source 120 is biased by a source bias generator circuit 160 to a small negative voltage of, e.g., 0.25V below the power ground ($V_{SS}$), while p-well 150 is kept at the power ground. This causes a forward-biased source-to-substrate junction. With a power ground $V_{SS}$ at 0 volts, a negative source bias, i.e., source voltage ($V_S$) less than 0V, directly causes a reduction in the threshold voltage ($V_T$) equal to the magnitude of $V_S$, plus a further reduction in $V_T$ due to the forward-bias body effect. For example, with $V_S = -0.25V$, and a body-effect of $-0.13V$, the change in $V_T$ is $-0.25V - 0.13V = -0.38V$. Hence, for a given applied source voltage magnitude (e.g., 0.25V), the reduction in $V_T$ (e.g., 0.38V) exceeds the magnitude of the voltage applied. The actual body effect for any particular transistor will vary depending on the doping profile and the process technology used in its construction.

By contrast, the conventional method of applying a positive voltage, e.g., +0.25V, to the substrate while keeping the source at ground ($V_{SS}$), will cause a reduction in $V_T$ due to body effect only. Thus the change in $V_T$ in such a case would only be $-0.13V$ based on the above example. Hence, in the conventional method, for a given applied voltage magnitude (e.g., 0.25V), the reduction in $V_T$ (e.g., 0.13V) is less than the magnitude of the voltage applied. Therefore, the present invention is far more effective in reducing the threshold voltage than the conventional method, for a given voltage applied to the transistor.

Since $I_{ON}$, the turned-on saturation current of a MOSFET, is proportional to $(V_{DD} - V_T)^2$, a reduction in $V_T$ is highly effective in boosting $I_{ON}$ which results in great improvement in circuit speed. For low-voltage circuit operation, e.g., 1.5V or less, the present invention is particularly effective in improving circuit speed.

Compared to the conventional method, the present invention is far more effective in reducing $V_T$ for a given applied bias voltage level. This means a lower source-to-substrate forward bias can be used to effectively boost circuit performance without causing excessive forward-bias leakage current and power loss due to an unnecessarily high bias voltage.

The source-to-substrate bias for an NMOSFET may be in the range of roughly $-0.05$ to $-0.65V$, and preferably between $-0.2V$ and $-0.5V$. For forward biasing the source node of an NMOSFET, the source-to-p-well voltage is biased negatively (<0V). The negative voltage applied to the source node can be generated by an on-chip charge-pump circuit in conjunction with a voltage-regulator circuit (not shown), or by other voltage generation schemes practiced by those skilled in the integrated circuit art. For a PMOSFET (shown, for example, in FIG. 10), the source-to-substrate bias is preferably in the same range of magnitudes as above, but with opposite sign.

Returning to the circuit in FIG. 3, source bias generator circuit 160 generates the negative voltage to be applied to source 210. A switch 170 is coupled between source 120, p-well 150, and circuit 160 and, in one position, connects circuit 160 with source 120. However, as noted above, when the substrate-source junction is forward biased, a leakage current occurs. Thus, for power savings, or other reasons such as preventing heat build-up on the chip, it may be desirable to ground or leave floating source 120 when a performance increase is not required. In other positions, switch 170 can also connect source 120 to $V_{SS}$ (ground) or leave the source floating, depending on a control signal (not shown) for controlling operation of switch 170. Switch 170 may be implemented by any known circuit, including an analog multiplexer integrated circuit, and is not limited to switching among three inputs as shown, but may switch among any number of inputs.

Figure 4:
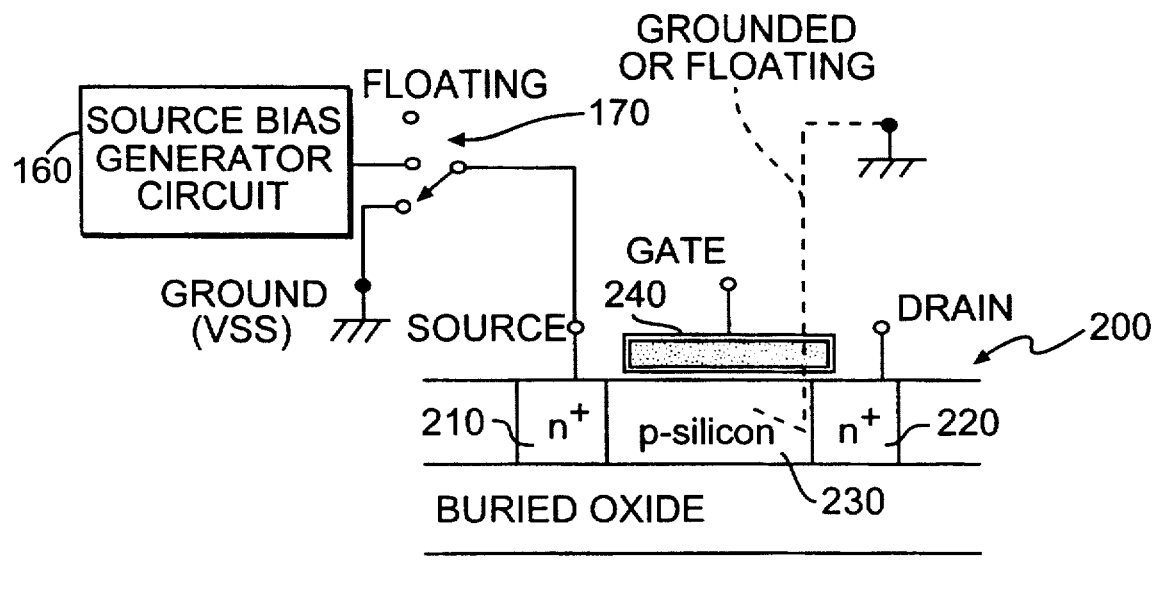
FIG. 4 is a schematic sectional side view of a SIMOX transistor connected according to the first embodiment of the present invention.

The present invention can be applied to silicon on insulator (SOI) or separation by implanted oxygen (SIMOX, equivalent to SOI, with buried oxide as insulator) technologies, with an additional benefit of less susceptibility to latch up. It should be noted that for a regular (non SOI) process, a forward-biased source-to-drain junction may induce latch-up, however this can be avoided by proper guard-ring design and/or decoupling of the n-well and p-well, as will be appreciated by those skilled in the art. FIG. 4 is a schematic sectional side view of a SIMOX transistor 200 to which a biasing voltage is applied according to the first embodiment of the present invention. SIMOX transistor 200 includes a source 210, a drain 220, a p-type body 230, and a gate 240. Transistor 200, shown by itself, is actually part of a layer extending from the source 210 and drain 220, covering the shown buried oxide layer. Switch 170 is connected between source bias generator circuit 160, source 210, and ground potential ($V_{SS}$). As a result, source 210 can be optionally switched to ground or left floating by switch 170 when the transistor is non-active or in a stand-by mode. This reduces power consumption of the circuit. Similarly, as indicated by the dashed line connected to p-type body 230, the body can also be switched to a floating state when in stand-by mode, either by switch 170, or by another switching circuit.

The present invention can be applied to a full chip, a circuit block or a critical circuit path. A critical circuit path of an integrated circuit (IC) is a sub-circuit comprising a number of mostly sequentially operative circuit elements. The elapsed time of a signal propagating through a critical circuit path tends to directly affect the overall performance of the IC.

The present invention can be applied to the critical circuit path as long as the IC is powered on, or it can be applied only when needed. While the former configuration uses more power, such use may be more desirable than the added space and power needed by switch 170 and any necessary control circuitry for switch 170. Such design trade-offs will be made by circuit designers for particular circuit uses and specifications.

Figure 5A:
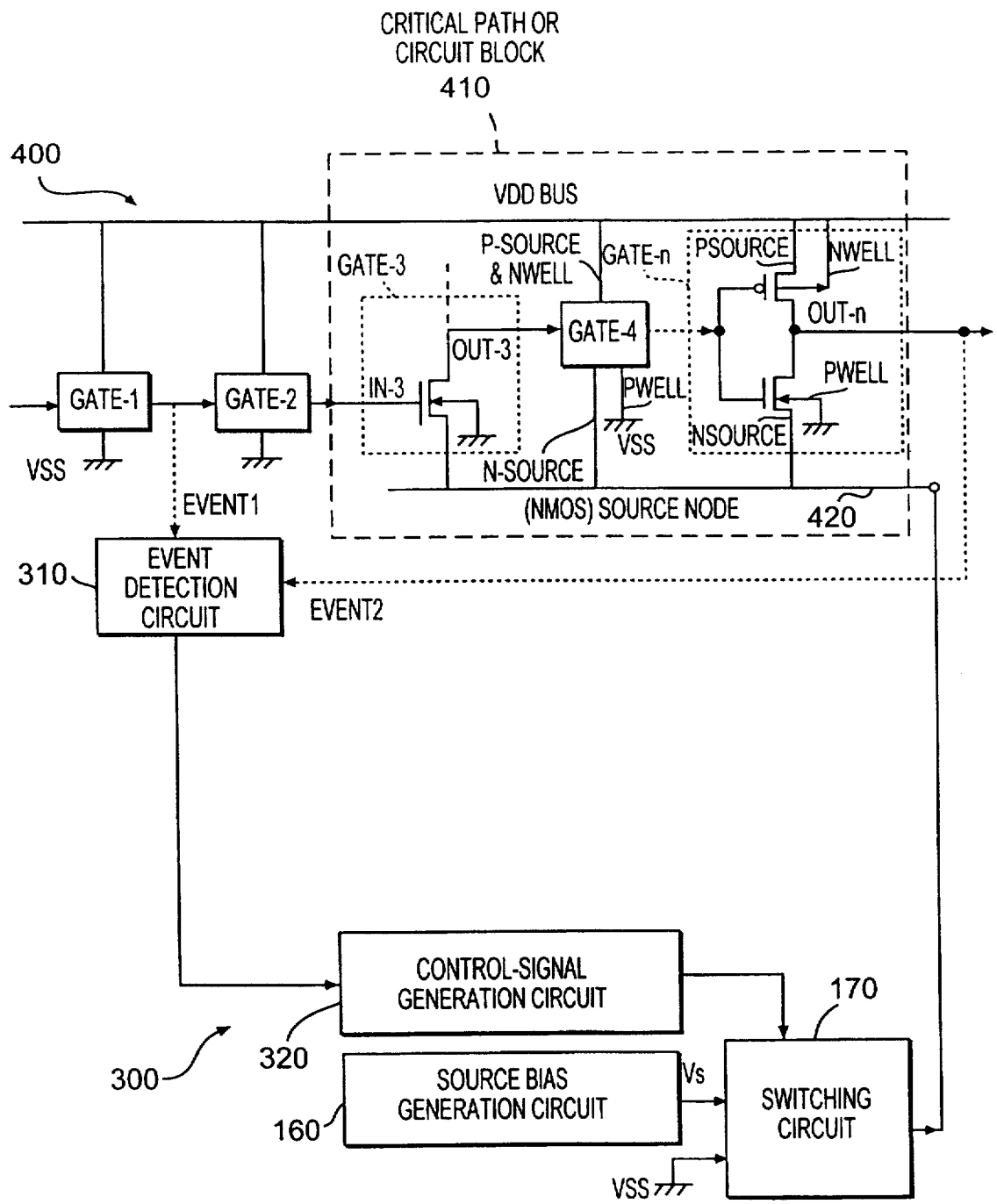
FIG. 5a illustrates a circuit for boosting speed in a critical path of another circuit upon detection of an event, according to a second embodiment of the invention.

In FIG. 5a, Gate-1, 2, 3, 4, . . . , and Gate-n each include at least one transistor, but each may include any combination of digital or analog circuits such as NAND, NOR, XOR, Flip-Flop, OP-AMPs . . . , etc. These gates may be either digital logic cells or analog cells. Different gates may perform different functions, or identical functions. Any or all of these gates may also contain CMOS elements, such as those shown in Gate-n. Where the specific structure in the gates is not illustrated (e.g., Gate-1 and Gate-2), the gates may contain both NMOSFET and PMOSFET transistors, but need not contain both types. Where there is only one connection from a gate to a power bus (e.g., in Gate-1 and Gate 2), it may be assumed that the transistor(s) in these gates are conventionally connected to the power bus, with the source and body tied together. Where, however, there are two connections shown to a power bus (e.g., in Gate-4), the body and source are connected according to the present invention, for example as shown in FIGS. 3 and 4. Specific gate structure will be illustrated (e.g., Gate-3 and Gate-n) where necessary for a complete understanding of the invention. Note that Gate-3 may contain other transistors, as indicated by the dotted connection from Out-3, but only a single NMOSFET is shown. Except as otherwise noted above, gates shown as blocks in the following figures are intended to be illustrative of the present invention, but not limiting.

FIG. 5a illustrates a circuit 300 for boosting speed in a critical path 410 of another circuit 400 upon detection of an event, according to a second embodiment of the invention.

The circuit 300 comprises an event detection circuit 310, a control signal generation circuit 320, source bias generation circuit 160, and switching circuit 170. Source bias generation circuit 160 and switching circuit 170 function as described above. Circuit 310 detects circuit events (e.g., event 1 and event 2), and triggers circuit 320 when these events are detected. Circuit 320 when triggered provides a control signal to switching circuit 170, which in turn connects bias potential $V_S$ to a source node 420. Gate-1, Gate-2, Gate-3, and Gate-4 through Gate-n constitute a sequentially connected series of gates through which a signal propagates. Gate-3 and Gate-4 through Gate-n within this series of gates constitute a critical path 410, the speed of which is critical to the device's performance. Source node 420 is a circuit node in critical path 410 to which the sources of Gate-3, Gate-4, and Gate-n are connected. During the period when the control signal from circuit 320 is ON, source node 420 of critical path 410 is biased at a negative voltage of, e.g., −0.35V. When the control signal is OFF, the source node is connected to ground (or may be left floating) in order to reduce the power consumption of the circuit. Alternatively, when the control signal is OFF, the source node may be connected to an intermediate voltage source at a potential between $V_{DD}$ and $V_{SS}$ for power savings. Alternatively, the control signal may be used to control the output of the control signal generator 320 such that the output $V_S$ may be a negative bias voltage or equal to $V_{SS}$.

An event detected by circuit 310 may include any "pre-event" prior to an internal signal propagating through the critical path. A pre-event can be a leading voltage transition, or a leading combination of logic states, which has a time lead before the internal signal enters the critical path. One such pre-event, event1, is shown in FIG. 5a as occurring after Gate-1 but before Gate-2. Though only one gate, Gate-2, is shown remaining before the critical path, the pre-event is positioned sufficiently before the critical path that the detection and switching circuitry (i.e., circuits 310, 320, and 170) can properly bias source node 420 prior to the signal entering the critical path 410. An event detected by circuit 310 may also include any "post-event" after the internal signal has propagated through the critical path, e.g., event2.

Figure 5C:
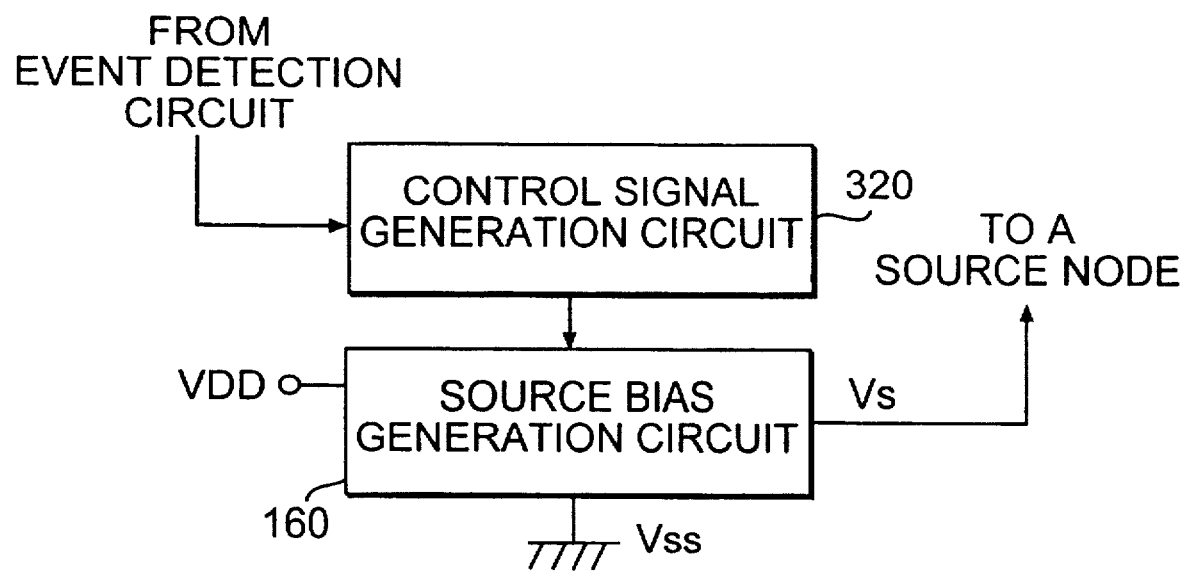
Figure 5B:
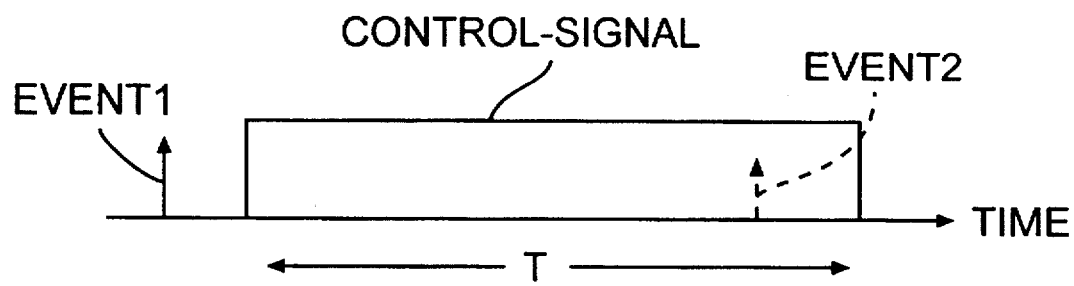

FIG. 5b is a timing diagram showing a sequence of events in FIG. 5a. In this example, a voltage transition between Gate-1 and Gate-2 (i.e., event1) is detected by event detection circuit 310. In response, circuit 320 generates a control signal for controlling switching circuit 170, which applies bias voltage $V_S$ to node 420. The control signal may be set for a predetermined delay time T by control signal generation circuit 320. Once the control signal is generated, the switching circuit 170 applies bias voltage $V_S$ to node 420 as previously described.

In an alternative mode of operation, the control signal in FIG. 5b can initially be set by the event1 pre-event detection, and then be reset by detecting a "post-event" (i.e., event2). Such a method allows for more accurate disabling of the control signal, rather than relying on some predetermined delay time T from circuit 320. A post-event can be a voltage transition at the output of the critical path, shown as event2 in FIG. 5b.

FIG. 5c illustrates a portion of circuit 300 which is alternatively implemented without switching circuit 170. Control signal generation circuit 320 functions similarly to that shown in FIG. 5a, except that it controls source bias generation circuit 160. The output $V_S$ from source bias generation circuit 160 can be a negative bias voltage, $V_{SS}$, $V_{DD}$, or some other voltage, depending on the control signal generated by circuit 320.

Figure 6:
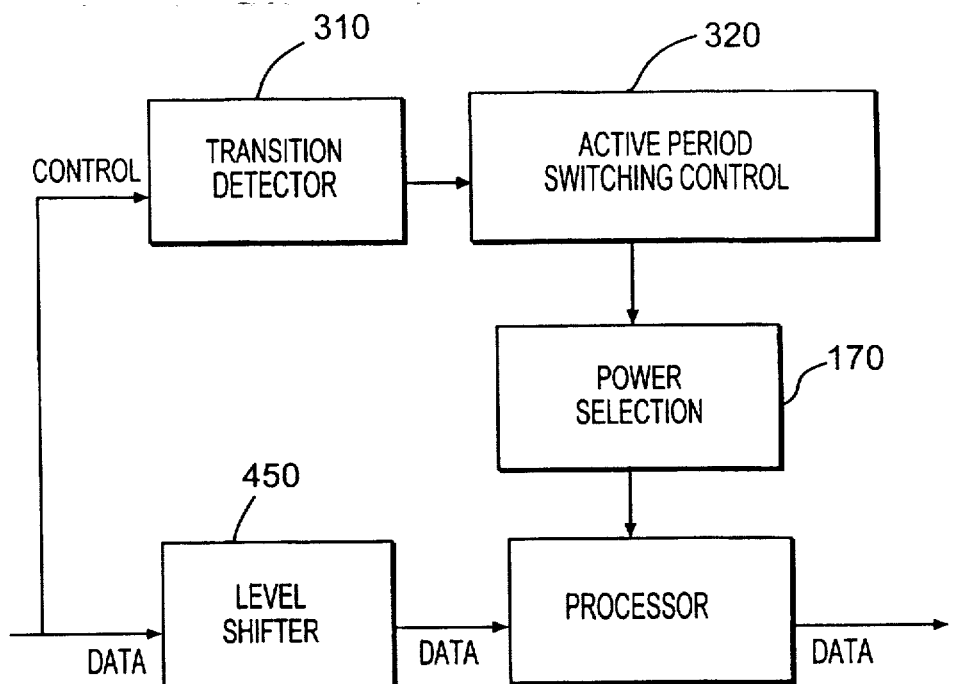
FIG. 6 is a circuit, shown in block diagram form, incorporating a level shifter at the start of a critical path of another circuit according to a third embodiment of the invention.

FIG. 6 is a circuit, shown in block diagram form, incorporating a level shifter at the start of a critical path of another circuit according to a third embodiment of the invention. The elements of FIG. 6 are functional blocks, and those blocks with functions similar to elements in FIG. 5a are identically numbered. Transition detector 310, active period switching control 32), and power selection 170 function the same as their like-numbered counterparts in FIG. 5a. The control signal generated by event detection in FIGS. 5a and 6 may alternatively be replaced by a signal related to the standby-mode or active-mode operation of the system. Processor 410 functions the same as the critical circuit path in FIG. 5a. Level shifter 450 is desirable in some cases, because negatively biasing the sources of transistors in processor 410 may cause interfacing problems with other transistors whose sources are not biased. For example, with a negatively biased source node, the reduction in the threshold voltage $V_T$ can be 0.4V or higher. Depending on the original $V_T$ and the degree of source bias, the new $V_T$ (with a forward-biased $V_S$) can be near 0V or even become negative. In such a case, a gate voltage of 0V from an unbiased transistor may not be able to turn the biased transistor off. One way of curing such an interfacing problem is to provide the biased transistor with a gate voltage lower than 0V, via level shifter 450; however, other ways of addressing the problem are also possible.

Figure 7:
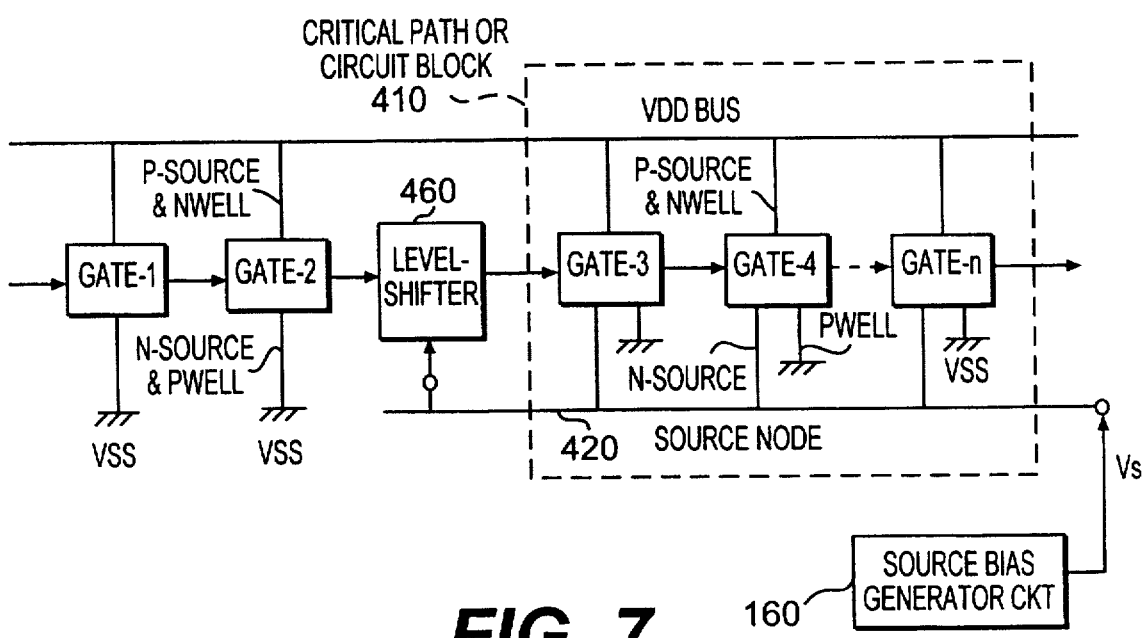
FIG. 7 is a circuit illustrating one way of implementing the level shifting of FIG. 6.
Figure 8:
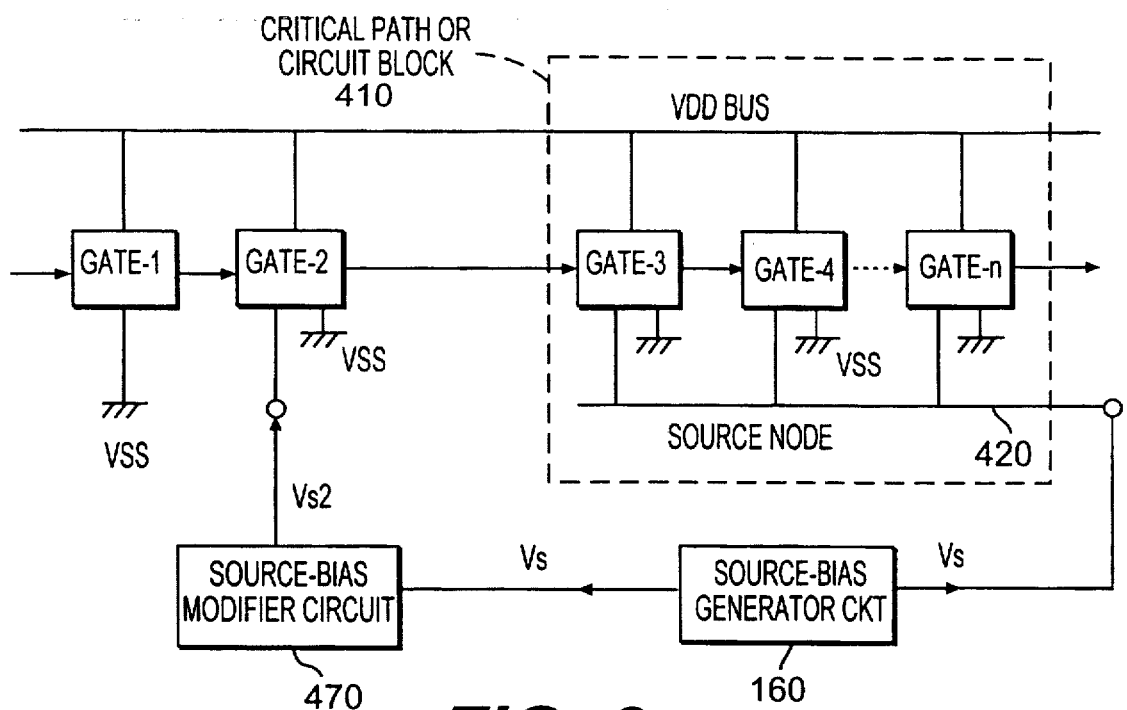
FIG. 8 is a circuit illustrating another way of implementing the level shifting of FIG. 6.
Figure 9:
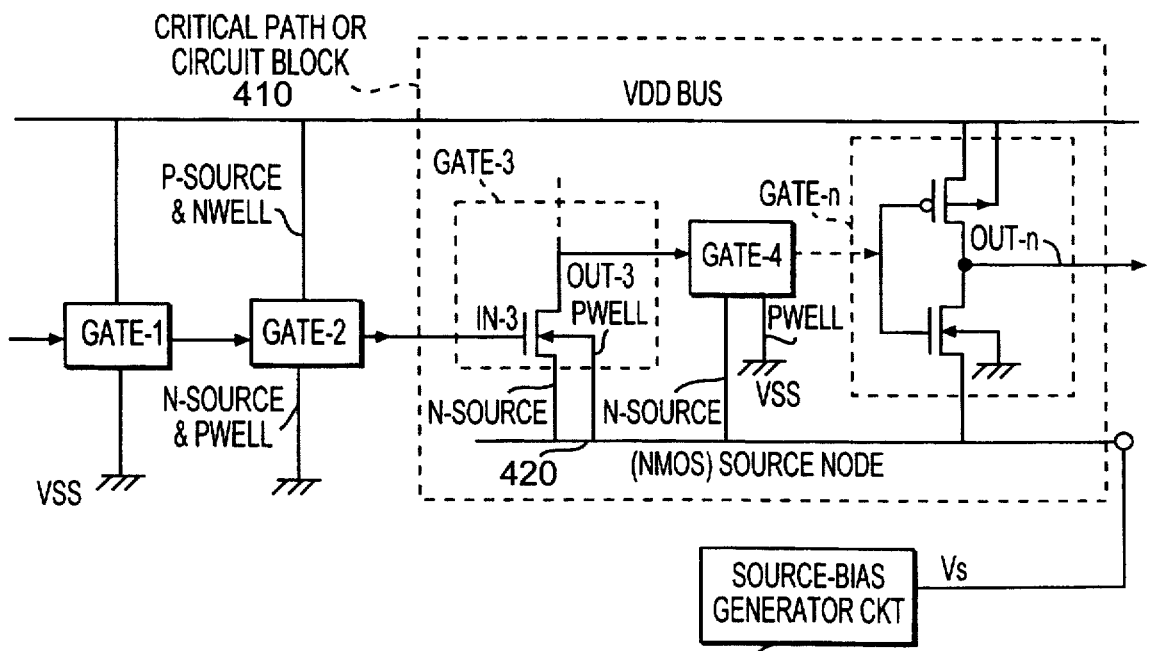
FIG. 9 is a circuit illustrating still another way of implementing the level shifting of FIG. 6.

FIGS. 7–9 show specific circuits for accomplishing the level shifting performed by level shifter 450 in FIG. 6. Though FIGS. 7–9 show source bias generator circuit 160 directly connected to source node 420, the bias voltage $V_S$ could alternately by supplied to node 420 via switch 170, as in FIGS. 5a and 6.

In FIG. 7, the function performed by level shifter 450 in FIG. 6 is performed by level shifter 460, which is located between Gate-2 and Gate-3. Level shifter 460 facilitates signal transition between Gate-2, having a source voltage at $V_{SS}$, and Gate-3, having a source voltage at $V_S$. If, for example, a negative bias voltage $V_S$ (e.g., −0.4V) from source bias generator circuit 160 is applied to source node 420 of the critical path (or a circuit block) 410, it would cause $V_T$ to be slightly negative (e.g., −0.05V) beginning with Gate-3. An output of Gate-2 of 0V cannot adequately turn off a pull-down circuit (not shown) in Gate-3, thereby causing a leakage current and additional power consumption, and preventing signal propagation. Level-shifter circuit 460 adjusts the low logic level of the output of Gate-2 to be the same level as the source node of the critical path (i.e., −0.4 instead of 0V), for effectively turning off the pull-down circuit of Gate-3 when the output of Gate-2 is logic low. The level shifter circuit 460 is shown in a block form, because such circuits are well known, and the details of their implementation will be apparent to those in the integrated circuit art.

In FIG. 8, the function performed by level shifter 450 in FIG. 6 is performed by Gate-2, the source of which is connected to a source bias modifier circuit 470. The source node of Gate-2 is connected to level shifter 460, producing an output low voltage of $V_{S2}$, which is between $V_{SS}$ and $V_S$. For example, if the negative bias voltage $V_S$ (e.g., −0.4V) from source bias generator circuit 160 is again applied to source node 420 of critical path 410, $V_T$ will be slightly negative (e.g., −0.05V) beginning with Gate-3. Source-bias modifier circuit 470 generates a voltage $V_{S2}$, e.g., −0.2V, which is a more moderately negative bias than $V_S$. $V_{S2}$ is applied to the source node of Gate-2 and will cause the output of Gate-2 to be at $V_{S2}$ when in a low logic state. When the output of Gate-2 is at $V_{S2}$, it is sufficient to turn off a pull-down circuit in Gate-3. $V_{S2}$ as generated by source-bias modifier circuit 470 should be somewhere between the critical-path source-node potential and the substrate potential. An example of source-bias modifier circuit 470 is a voltage divider, though other implementations will now be apparent to those in the integrated circuit art.

FIG. 9 shows another effective circuit for gradual $V_T$ reduction. In FIG. 9, in contrast to FIGS. 7 and 8 which performed level shifting prior to critical path 410, the function performed by level shifter 450 in FIG. 6 is performed by Gate-3, the first gate in critical path 410. To effect a transition between Gate-2 and Gate-4, both of Gate-3's source and body are tied to source node 420. In the case when a p-type well can be isolated (e.g., in the case of SOI technology, n-substrate or triple-well process), both the source node and the p-well for a leading NMOSFET (Gate-3) in the critical circuit path 410 can be connected to the source node 420. The threshold reduction of the NMOSFET in Gate-3 is less than that of Gate-4 through Gate-n. For example, the NMOSFETs in Gate-1 and Gate-2 may have a regular $V_T$ of 0.6V. A bias of $V_S$=−0.4V applied to both the source and body of the NMOSFET in Gate-3 causes its threshold voltage $V_T$ to become 0.6V−0.4V=+0.2V. As previously explained, the threshold voltage $V_T$ of NMOSFETs in Gate-4 through Gate-n becomes, for example, 0.6V−0.4V−body-effect=−0.05V. With this gradual reduction in $V_T$, each NMOSFET can be turned off when the output of the previous gate is in a logic Low state. In other words, the output Low of Gate-2 is 0V, which is sufficient to turn off the NMOSFET of Gate-3 ($V_T$=0.2V). Also, the output low of Gate-3 is −0.4V, which is sufficient to turn off NMOSFET of Gate-4 ($V_T$=−0.05V). Gate-3 is still shown within the critical path 410, because it will receive some speed increase due to a reduction in $V_T$, even though its reduction (and hence its speed increase) will not be as large as for Gate-4 through Gate-n.

Figure 10:
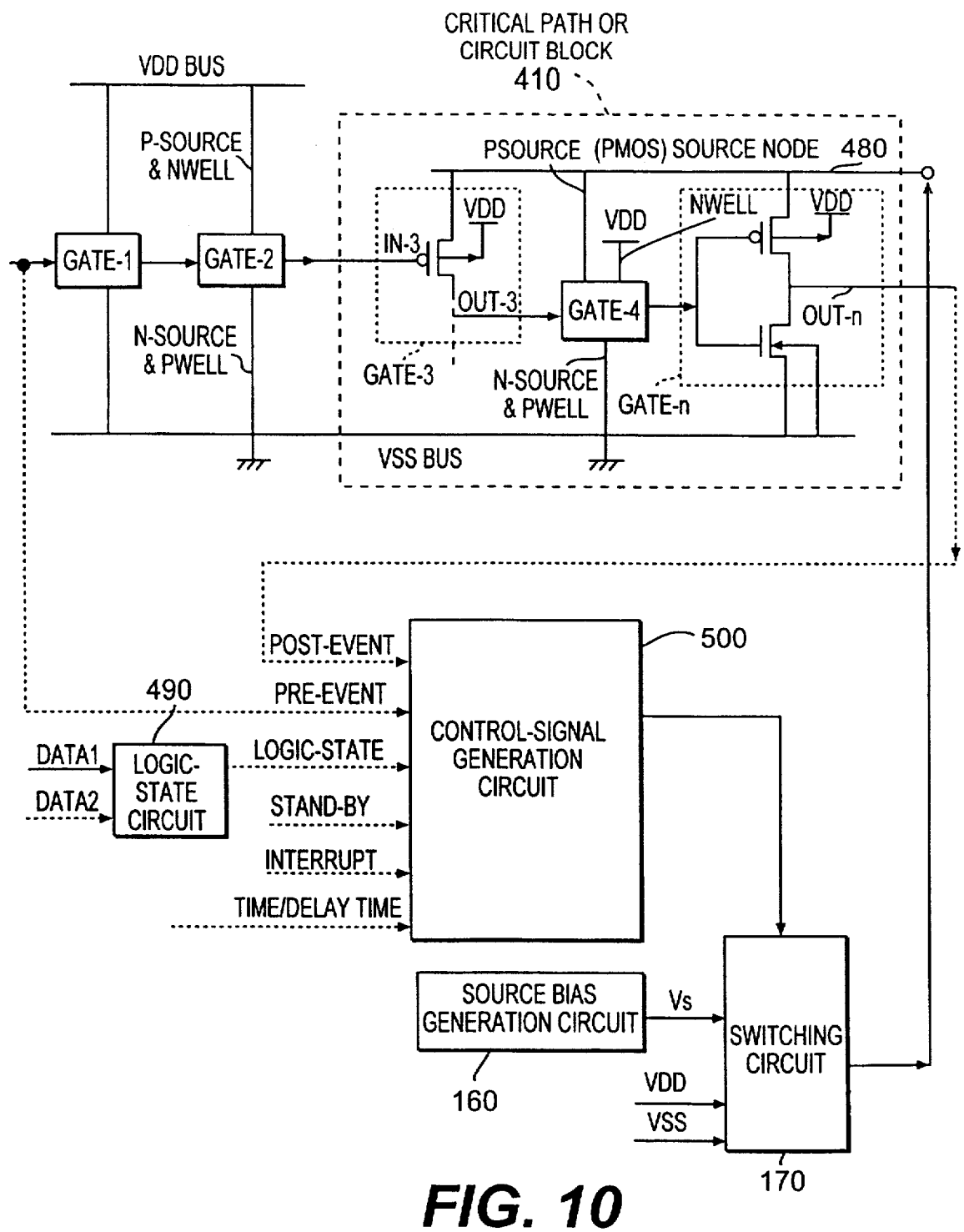
FIG. 10 is a circuit for controlling a critical path of another circuit upon the detection of an event, and biasing of a PMOSFET, according to a fourth embodiment of the invention.

FIG. 10 illustrates a circuit including a PMOS source node 480, to which the sources of Gate-3 through Gate-n in critical path 410 are attached. The circuit in FIG. 10 also includes a logic state circuit 490, whose output is triggered by one or a combination of input logic states and is connected to a control-signal generation circuit 500. Control-signal generation circuit 500 can generate a control signal for controlling switching circuit 170 based on a pre-event, a post-event, a logic state from logic operation of a set of data (i.e., from circuit 490), a standby/non-standby signal, an interrupt signal from on-chip or from off-chip, a time or delay-time data, or combinations thereof. Thus, the present invention is not limited to an implementation which is biased all the time, or to an implementation, as in FIG. 5a, which is pre-event driven. As illustrated in FIG. 10, control signal generation circuit 500 may be triggered by, for example, a logic state in some other portion of the system which is decoded by logic state circuit 490. The control signal may also be triggered from a dedicated standby signal or an interrupt signal. Those skilled in the art will now appreciate that various combinations of the above control signals may be used in particular IC designs.

Either alternatively to biasing the source in NMOSFETs, or in addition to such biasing, the present invention can also be applied to PMOSFETs as shown in FIG. 10. For forward biasing the source node of a PMOSFET, the source-to-n-well voltage is biased positively, i.e., V(n-well)=$V_{DD}$ while V(source node 480)>$V_{DD}$. For example, for a circuit with $V_{DD}$=0.9V, the source node of PMOSFET can be biased at $V_{DD}$+0.2V=1.1 V, and the n-well can be biased at $V_{DD}$=0.9V. Such an arrangement is shown in FIG. 10 in the PMOSFETs of Gate-3 and Gate-n.

For example, in FIG. 10, the source bias generation circuit 160 can generate a source-node potential Vs that is greater than $V_{DD}$. This greater Vs may be applied to the PMOS source node 480 of a circuit block by switching circuit 170, or without a switching circuit, such as shown in FIG. 5c, for a performance improvement. The potential of the PMOS source node can be changed to $V_{DD}$ when in a stand-by mode or when not in a speed-boosting mode, as previously discussed for the NMOS source node.

Furthermore, a source-node potential less than $V_{SS}$ can be applied to both the NMOS source node and the p-well (p-substrate) of NMOSFETs at the same time as the PMOS source node is biased with a potential that is greater than $V_{DD}$. For example, for a CMOS circuit with $V_{DD}$=0.9V, the source node of the PMOSFET can be biased at $V_{DD}$+0.2V= 1.1V, and the n-well at $V_{DD}$=0.9V, while the source node of the NMOSFET can be biased at −0.2V, and the p-substrate (p-well) at $V_{SS}$−0V. The source node potential for the PMOSFET may be switched between $V_{DD}$ and a potential greater than $V_{DD}$, and the source node potential for the NMOSFET may be switched between $V_{SS}$ and a potential less than $V_{SS}$, based on a single control signal.

While it is possible to bias the sources of both PMOSFETs and NMOSFETs according to the present invention, it may not always be desirable to do so. Biasing both transistors in a CMOS pair, for example, requires two biasing voltages to be generated, as well as two sets of circuit traces to distribute these biasing voltages. The present invention, in contrast to a conventional substrate biasing method, achieves a performance increase when only applying a bias to, for example, the NMOSFET in a CMOS inverter (e.g., Gate-n in FIG. 5a).

For example, the NMOSFET's source would be biased with, for example, −0.25V, resulting in the lowering of $V_T$ in the NMOSFET by 0.38V as explained above. The threshold voltage in the PMOSFET would remain unchanged, but the voltage difference between the logic-low voltage, −0.25V, and the PMOSFET's threshold voltage increases by 0.25V, thereby increasing the PMOSFET's ON-current ($I_{ON}$) as well. By contrast, to speed up both transistors in a CMOS inverter using a conventional substrate biasing method requires that a bias be applied to the PMOSFET substrate for any PMOSFET performance improvement. In comparison with both NMOSFET and PMOSFET substrates biased in a conventional CMOS inverter, a CMOS inverter according to the present invention with just the NMOSFET source biased achieves better performance.

Figure 11A:
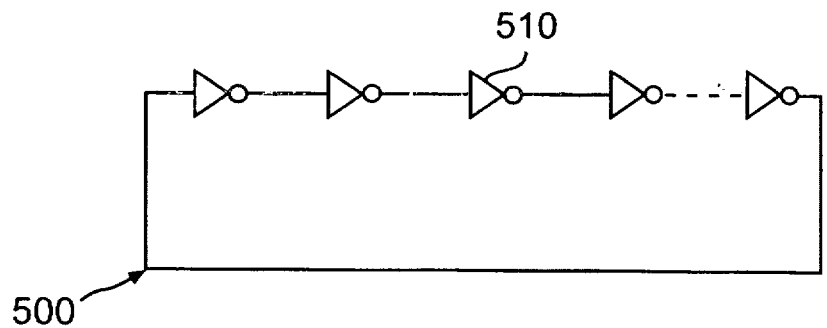
FIG. 11a is a schematic representation of an inverter-chain ring oscillator.
Figure 11B:
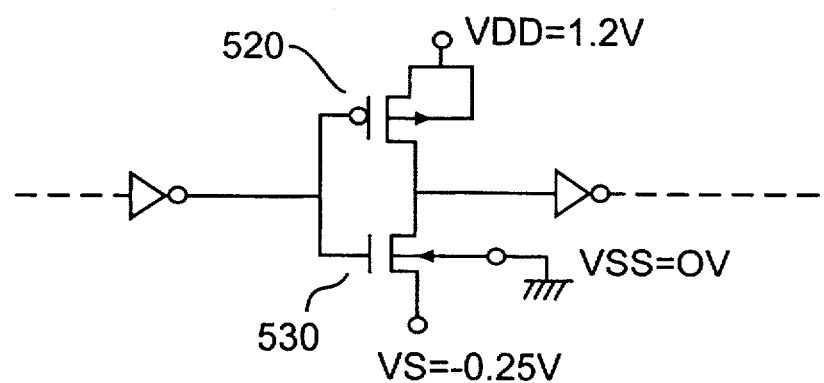
FIG. 11b is a circuit diagram of an inverter in the ring oscillator of FIG. 11a according to the present invention.

To demonstrate the better performance of the CMOS inverter according to the present invention, simulations were performed for a circuit according to the present invention, an identically configured circuit constructed using conventional substrate biasing, and a third identically configured circuit with no substrate biasing. The simulated circuit consisted of a ring oscillator 500, shown schematically in FIG. 11a, constructed of eleven stages, each of which consisted of a CMOS inverter 510 including a PMOS transistor 520 and an NMOS transistor 530 configured according to the present invention as shown in FIG. 11b. Simulation results showed that, for 1.2V CMOS operation, a source bias of −0.25V applied to NMOSFET 530, the p-substrate being grounded and PMOSFET 520 having no substrate biasing, improved the ring oscillator performance by about 2.5 times over a ring oscillator with no substrate biasing. In this circuit constructed according to the invention, the oscillator's frequency increased from 9.7 MHZ to 23.8 MHZ.

Figure 11C:
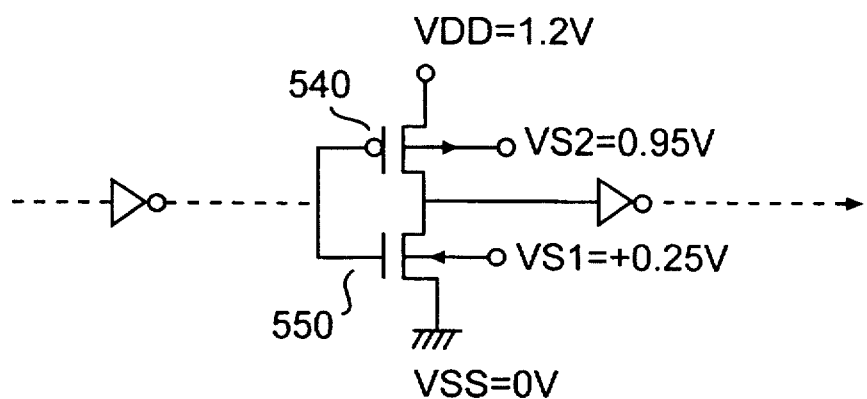
FIG. 11c is a circuit diagram of an inverter in the ring oscillator of FIG. 11a whose substrates are conventionally biased.

By comparison, an inverter using the conventional substrate biasing method is shown in FIG. 11c. A p-substrate bias of +0.25V (source being grounded) applied to an NMOSFET 550, and a +0.95V bias to the n-substrate of a PMOSFET 540 improved the ring oscillator performance by about 1.47 times over a ring oscillator with no substrate biasing. In this circuit constructed according to the conventional substrate biasing method, the oscillator's frequency only increased from 9.7 MHZ to 14.3 MHZ.

It will be apparent to those skilled in the art that various modifications and variations can be made in the method of the present invention and in its implementation without departing from the scope or spirit of the invention. As an example, in a pair of CMOS transistors, either one, or both, of the NMOSFET and PMOSFET may have its source biased as outlined above. Though this invention has been described in relation to field effect transistors (FETs), it is applicable to other types of transistors having a substrate or body terminal (including all IGFETS). The speeding up of a critical path may be performed within a circuit, on a chip or integrated circuit level, or on a system level, depending on the desired application. For example, in an electronic system (e.g., a motherboard), one integrated circuit may contain NMOSFETs and PMOSFETs which are not biased, and another integrated circuit in the same system may contain at least an NMOSFET biased according to the present invention. It is specifically contemplated that the present invention will apply to not only logic gates, but also operational amplifiers, and other types of digital and analog elements comprising transistors.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An apparatus, comprising:
    a first CMOS circuit having a first NMOSFET and a first PMOSFET;
    a second CMOS circuit having a second NMOSFET and a second PMOSFET;
    a first power node coupled to a source terminal of the first NMOSFET;
    a second power node selectively coupled to a source terminal of the second NMOSFET; and
    a third power node coupled to source terminals of the first and second PMOSFETs;
    wherein the source terminal of the second NMOSFET is forward biased with respect to its substrate.

2. The apparatus of claim 1, wherein substrate of the first and second NMOSFETs are coupled to the first power node.

3. The apparatus of claim 1, wherein a voltage difference between the first and second power nodes is at most 0.65V.

4. The apparatus of claim 1, wherein the source terminal of the second NMOSFET is connected to the first power terminal when the second CMOS circuit is in stand-by mode.

5. The apparatus of claim 1, wherein the first and second CMOS circuits are in different integrated circuits.

6. An integrated circuit comprising:
    a first supply voltage node and a second supply voltage node;
    a first gate connected by the first and second supply voltage nodes;
    a second gate connected by the first and second supply voltage nodes and a bias voltage node such that the second gate functions faster than the first gate, the second gate being coupled to an output of the first gate; and a level shifter connected between the first and second gates, to shift a level of the output of the first gate so that it can effectively operate the second gate.

7. The integrated circuit of claim 6, wherein the level shifter includes a level shifting circuit connected to the bias voltage node.

8. The integrated circuit of claim 6, wherein the level shifter includes a third gate connected to a modified bias voltage, which is derived from the bias voltage node.

9. The integrated circuit of claim 6, wherein the level shifter includes a transistor having both its source and substrate connected he bias voltage node.

10. The integrated circuit of claim 6, wherein the bias voltage node is coupled to a source node of an NMOSFET of the second gate.

11. The integrated circuit of claim 10, wherein the bias voltage causes a forward bias of the source node to the substrate of the NMOSFET.

* * * * *